United States Patent
Takeoka et al.

(10) Patent No.: US 10,889,206 B2
(45) Date of Patent: Jan. 12, 2021

(54) STATION BUILDING POWER SUPPLY DEVICE AND CHARGED-STATE DETECTION METHOD

(71) Applicant: Mitsubishi Electric Corporation, Tokyo (JP)

(72) Inventors: Toshiaki Takeoka, Tokyo (JP); Shinichi Matsumoto, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 118 days.

(21) Appl. No.: 16/313,528

(22) PCT Filed: Jul. 4, 2016

(86) PCT No.: PCT/JP2016/069824
§ 371 (c)(1),
(2) Date: Dec. 27, 2018

(87) PCT Pub. No.: WO2018/008074
PCT Pub. Date: Jan. 11, 2018

(65) Prior Publication Data
US 2019/0225113 A1 Jul. 25, 2019

(51) Int. Cl.
*B60M 3/06* (2006.01)
*B60M 5/00* (2006.01)
(Continued)

(52) U.S. Cl.
CPC ............... *B60M 3/06* (2013.01); *B60M 1/12* (2013.01); *B60M 5/00* (2013.01); *G01R 19/16571* (2013.01); *G01R 19/16576* (2013.01)

(58) Field of Classification Search
CPC ............................................... B60M 3/06
(Continued)

(56) References Cited

U.S. PATENT DOCUMENTS

| | | | | |
|---|---|---|---|---|
| 6,396,166 B1 * | 5/2002 | Kim | ............... | H02J 9/005 307/112 |
| 6,522,033 B1 * | 2/2003 | Nevo | ............... | H03H 5/12 307/125 |

(Continued)

FOREIGN PATENT DOCUMENTS

| | | |
|---|---|---|
| JP | 48-32532 Y1 | 10/1973 |
| JP | 03-093422 A | 4/1991 |

(Continued)

OTHER PUBLICATIONS

International Search Report (PCT/ISA/210) dated Sep. 20, 2016, by the Japan Patent Office as the International Searching Authority for International Application No. PCT/JP2016/069824.
(Continued)

*Primary Examiner* — Adi Amrany
(74) *Attorney, Agent, or Firm* — Buchanan Ingersoll & Rooney PC

(57) ABSTRACT

A station building power supply device includes a circuit breaker to disconnect a connection with a train side, a circuit breaker to disconnect a connection with the station load side, a power converter disposed between the circuit breaker and the circuit breaker to convert the regenerative power into the AC power, a housing that houses the circuit breaker, the power converter, and the circuit breaker, a voltage sensor that detects a charged state of the housing, and a control unit that controls operations of the circuit breaker, of the power converter, and of the circuit breaker based on a detection result from the voltage sensor.

15 Claims, 9 Drawing Sheets

(51) Int. Cl.
*B60M 1/12* (2006.01)
*G01R 19/165* (2006.01)

(58) Field of Classification Search
USPC .......................................................... 307/125
See application file for complete search history.

(56) References Cited

U.S. PATENT DOCUMENTS

| | | | |
|---|---|---|---|
| 7,728,456 B2* | 6/2010 | Kusubayashi | B60L 1/00 |
| | | | 307/26 |
| 2003/0063418 A1* | 4/2003 | Bergh | H01H 47/32 |
| | | | 361/51 |
| 2004/0145841 A1* | 7/2004 | Lambardin | H02H 3/332 |
| | | | 361/42 |
| 2012/0048326 A1 | 3/2012 | Matsuo et al. | |
| 2015/0165931 A1* | 6/2015 | Hanashima | B60M 3/06 |
| | | | 191/4 |
| 2015/0207329 A1* | 7/2015 | Tanaka | H02J 5/00 |
| | | | 307/20 |
| 2015/0261247 A1* | 9/2015 | Tanaka | G05F 3/04 |
| | | | 307/24 |
| 2016/0161935 A1 | 6/2016 | Tominaga et al. | |
| 2016/0268803 A1* | 9/2016 | Matsumura | H02J 3/00 |
| 2016/0377670 A1* | 12/2016 | Tamida | G01R 31/50 |
| | | | 324/551 |

FOREIGN PATENT DOCUMENTS

| | | |
|---|---|---|
| JP | 05-347120 A | 12/1993 |
| JP | 2010239827 A | 10/2010 |
| JP | 2014-040127 A | 3/2014 |
| JP | 2015-107766 A | 6/2015 |
| JP | 2016-094054 A | 5/2016 |
| WO | 2012/026449 A1 | 3/2012 |
| WO | 2015/019466 A1 | 2/2015 |
| WO | 2015/076075 A1 | 5/2015 |

OTHER PUBLICATIONS

Japanese Office Action (Notification of Reasons for Refusal) dated Sep. 25, 2018, issued in Japanese Patent Application No. 2018-525849, and a English Translation thereof. (6 pages).
Written Opinion (PCT/ISA/237) dated Sep. 20, 2016, by the Japan Patent Office as the International Searching Authority for International Application No. PCT/JP2016/069824.

* cited by examiner

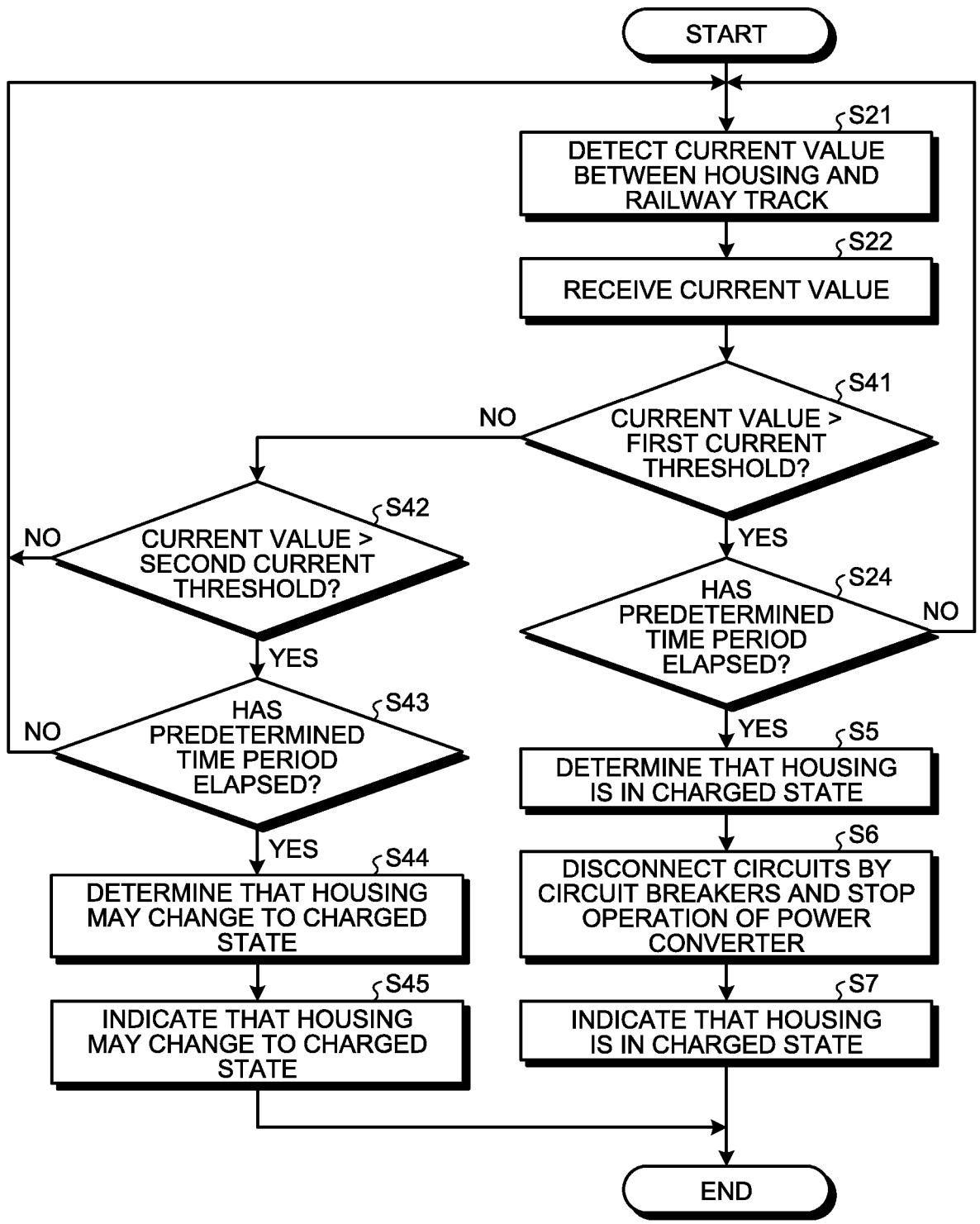

STATION BUILDING POWER SUPPLY DEVICE AND CHARGED-STATE DETECTION METHOD

FIELD

The present invention relates to a station building power supply device (hereinafter also referred to simply as "station power unit"), installed in a railway station, that uses alternating current (AC) power supplied from an AC system and excess regenerative power from a train in combination to supply electric power to electrical facilities in station premises, and to an electrically charged (hereinafter also referred to simply as "charged")—state detection method.

BACKGROUND

In recent years, regenerative power generated by a regenerative brake in a direct current (DC)-fed train is utilized as running power for another train through a feeder line. In such a DC feeder system, regenerative power exceeding the running power causes the feeder voltage to increase, while regenerative power falling below the running power causes the feeder voltage to decrease within a same electric power substation supply area.

Patent Literature 1 discloses a technology in which a station power unit converts excess regenerative power generated when regenerative power exceeds running power, into AC power, and supplies the AC power to electrical facilities in station premises, such as an air conditioning apparatus, lighting equipment, and an elevator via an AC system without using other devices. As used herein, an electrical facility in station premises is referred to as station load. Patent Literature 2 discloses a technology in which a station power unit stores excess electrical power on a feeder line exceeding the power consumption of the station loads, in a secondary battery, and upon a decrease of the feeder voltage, discharges the secondary battery to supply DC power to the feeder line. The station power units described in Patent Literatures 1 and 2 enable the feeder voltage to stabilize, and at the same time, excess regenerative power to be effectively utilized without allowing the excess regenerative power to flow back into the AC system.

CITATION LIST

Patent Literature

Patent Literature 1: WO 2015/019466 A
Patent Literature 2: Japanese Patent Application Laid-open No. 2014-40127

SUMMARY

Technical Problem

A station power unit includes electric components housed in a housing, and is installed in an end portion of a station platform, or in the electric room in a station building. In a scheduled inspection of a station power unit once every few years, maintenance personnel of a railway operating company open an inspection door of the housing of the station power unit to inspect electric components housed in the housing, wiring, the housing, and the like for any abnormal condition. In such conventional station power units, occurrence of electrical leakage, insulation deterioration in wiring, and/or the like may electrically charge the housing of the station power unit due to a voltage applied from the feeder line side. However, the maintenance personnel cannot know that the housing of the station power unit is in a charged state. This presents a problem in that the maintenance personnel may touch the electrically charged housing of the station power unit during a scheduled inspection.

The present invention has been made in view of the foregoing, and it is an object of the present invention to provide a station building power supply device capable of detecting that the housing is in a charged state.

Solution to Problem

To solve the problem and achieve the object described above, the present invention is directed to a station building power supply device that converts regenerative power generated by a regenerative brake of a DC-fed train, into AC power, and supplies the AC power to a station load side. The station building power supply device includes a first circuit breaker that disconnects a connection with a DC-fed train side, a second circuit breaker that disconnects a connection with the station load side, and a power converter that is disposed between the first circuit breaker and the second circuit breaker and converts the regenerative power into the AC power. The station building power supply device further includes a housing that houses the first circuit breaker, the power converter, and the second circuit breaker, a charged-state detection unit that detects a charged state of the housing, and a control unit that controls operations of the first circuit breaker, of the power converter, and of the second circuit breaker based on a detection result from the charged-state detection unit.

Advantageous Effects of Invention

The present invention is advantageous in being capable of detecting that the housing is in a charged state.

BRIEF DESCRIPTION OF DRAWINGS

FIG. 10 is a flowchart illustrating a charged-state detection process performed in a station power unit according to a fifth embodiment.

DESCRIPTION OF EMBODIMENTS

A station power unit and a charged-state detection method according to embodiments of the present invention will be described in detail below with reference to the drawings. Note that these embodiments are not intended to limit the scope of this invention.

First Embodiment

Figure 1:
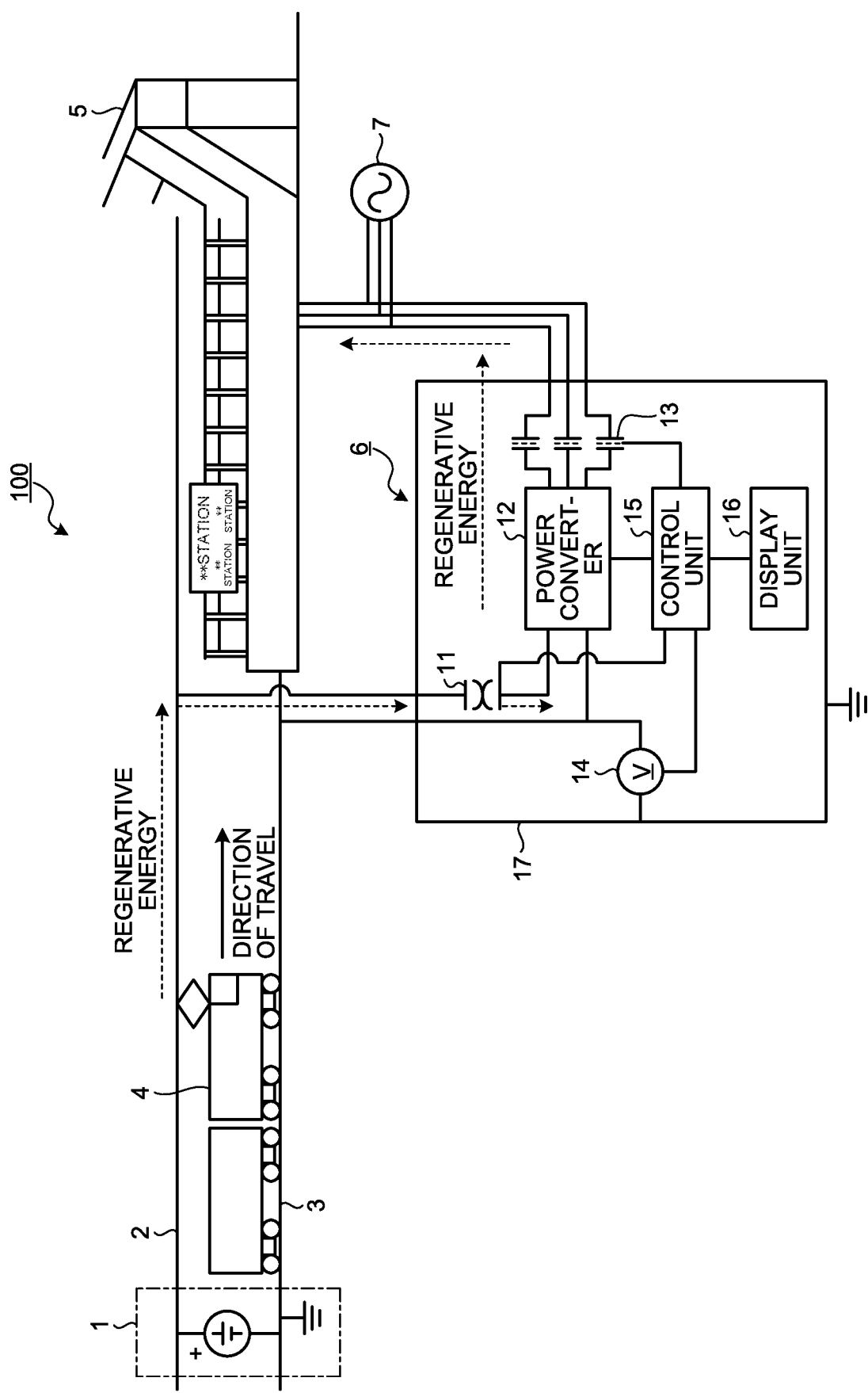
FIG. 1 is a diagram illustrating an example configuration of a railway system including a station power unit according to a first embodiment.

FIG. 1 is a diagram illustrating an example configuration of a railway system 100 including a station power unit 6 according to a first embodiment of the present invention. The railway system 100 includes an electric power substation (hereinafter referred to simply as "substation") 1, an overhead line 2, a railway track (i.e., a pair of rails) 3, a train 4, a station load 5, a station power unit 6, and a commercial power supply 7.

The substation 1 is a DC feeder system, and is located in a same substation supply area as that of the railway station in which the station power unit 6 is installed. The substation 1 supplies running power that will act as driving force, to the train 4 running within the substation supply area served by the substation 1. Although FIG. 1 depicts only one train as the train 4, multiple ones of the train 4 are running in the substation supply area served by the substation 1.

The overhead line 2 serves as a current path when electric power from the substation 1 is supplied to the train 4. The overhead line 2 also serves as a current path when regenerative power generated by braking of the train 4 is supplied to another train 4 (not illustrated) or to the station power unit 6.

The railway track 3 is a track on which the train 4 runs. The railway track 3 is also a path that serves as a return line for the current returning back to the substation 1 through the train 4 after the electric power supplied from the substation 1 is consumed in the train 4 as running power.

The train 4 is a DC-fed train that consumes electric power from the substation 1 as running power. In addition, the train 4 generates regenerative power that will serve as braking power for the train 4 during braking when the train 4 stops at a station and/or in other occasion. The train 4 supplies the regenerative power generated, to another train 4 (not illustrated) or to the station power unit 6 through the overhead line 2.

Examples of the station load 5 include electrical facilities, such as an air conditioning apparatus, lighting equipment, and an elevator, in the station premises in which the station power unit 6 is installed. The station load 5 uses both AC power supplied from the commercial power supply 7, being an AC system, and AC power generated by the station power unit 6 by conversion of excess regenerative power from the train 4.

The station power unit 6 is installed in a railway station that uses both AC power supplied from the AC system and excess regenerative power from the train 4, and supplies electric power to the station load 5. The station power unit 6 converts, into AC power, the electric power left unconsumed after consumption of regenerative power generated by a regenerative brake of the train 4 as running power that will act as driving force of another train 4, that is, regenerative power in an amount by which the regenerative power exceeds the running power, i.e., excess regenerative power. The station power unit 6 then supplies the AC power to the station load 5 side. FIG. 1 indicates the regenerative power generated in the train 4 as "regenerative energy", which is illustrated as flowing from the train 4 through the station power unit 6 to the station load 5.

The commercial power supply 7 is an AC system that supplies AC power to the station load 5.

A configuration of the station power unit 6 will now be described. The station power unit 6 includes a circuit breaker 11, a power converter 12, a circuit breaker 13, a voltage sensor 14, a control unit 15, a display unit 16, and a housing 17.

The circuit breaker 11 interrupts an excessive fault current from the overhead line 2 and the like. The circuit breaker 11 is a first circuit breaker for disconnecting a connection between the station power unit 6 and the circuit on the train 4 side, i.e., the train 4 side. The circuit breaker 11 connects the train 4 side with the station power unit 6 during normal operation. One example of the circuit breaker 11 is a high-speed circuit breaker.

The power converter 12 is disposed between the circuit breaker 11 and the circuit breaker 13, and converts excess regenerative power occurred in the train 4 into an AC voltage for the AC system of the commercial power supply 7 for use by the station load 5.

The circuit breaker 13 is a second circuit breaker for disconnecting a connection between the station power unit 6 and the circuit on the station load 5 side, i.e., the station load 5 side. The circuit breaker 13 connects the station load 5 side with the station power unit 6 during normal operation. One example of the circuit breaker 13 is an output electromagnetic contactor.

The voltage sensor 14 detects a voltage value that is the value of the voltage between the housing 17 housing the circuit breaker 11, the power converter 12, and the circuit breaker 13, which are electric components of the station power unit 6, and the railway track 3. The voltage sensor 14 is a charged-state detection unit that detects a charged state of the housing 17. The voltage sensor 14 serving as a charged-state detection unit may also be installed outside, rather than inside, the housing 17 of the station power unit 6. This also applies to the charged-state detection unit described in the later embodiments.

The control unit 15 controls operations of the circuit breakers 11 and 13, and of the power converter 12 based on the voltage value detected by the voltage sensor 14, i.e., the detection result from the voltage sensor 14. The control unit 15 also controls what is displayed on the display unit 16.

The display unit 16 displays the charge status of the housing 17. If the control unit 15 determines that the housing 17 is in a charged state, the control unit 15 controls the display unit 16 to indicate that the housing 17 is in a charged state on the display unit 16. The display unit 16 may use a liquid crystal display (LCD) or the like to indicate, in characters, that the housing 17 is in a charged state, or use a light emitting diode (LED) or the like and turn on the LED when the housing 17 is in a charged state. The display unit 16 is disposed at a location that allows maintenance personnel of the railway operating company to see the display unit 16 without making contact with the housing 17. The location of the display unit 16 may be a location in a station office or the like where the display unit 16 can be seen by the maintenance personnel, that is, a location apart from the station power unit 6, rather than a location on the housing 17. In this case, the control unit 15 of the station power unit 6 and the display unit 16 may be connected with each other via wire or wirelessly. In addition, the station power unit 6 may include the display unit 16 at both of a location on the housing 17 and a location apart from the station power unit 6.

The housing 17 is a box frame or casing that houses electric components of the station power unit 6, such as the circuit breaker 11, the power converter 12, and the circuit breaker 13.

In the railway system 100, the railway track 3 is grounded in the substation 1, while the housing 17 is grounded in the station power unit 6. However, depending on the locations of grounding in the substation 1 and in the station power unit 6, or if the substation 1 and the station power unit 6 are located far apart from each other, the ground potentials may differ from each other, thereby possibly generating a potential difference between the railway track 3 and the housing 17. Moreover, occurrence of electrical leakage or insulation deterioration in wiring of electric components in the station power unit 6 may electrically charge the housing 17 due to a voltage applied from the overhead line 2 side. The electric power supplied from the substation 1 to the overhead line 2 has a voltage of, for example, 1500 V. Maintenance personnel of the railway operating company perform a scheduled inspection on the station power unit 6 once every few years. During the inspection, the housing 17 in a charged state of the station power unit 6 may result in a situation in which the maintenance personnel touch the housing 17 in a charged state.

Thus, following a determination that the housing 17 is in a charged state, the station power unit 6 provides control to interrupt the connection with (i.e., the circuit including) the DC feeder system on the overhead line 2 side, and the connection with (i.e., the circuit including) the AC system on the station load 5 side, and to stop the operation of the power converter 12. In addition, following a determination that the housing 17 is in a charged state, the station power unit 6 provides control to indicate that the housing 17 is in a charged state on the display unit 16. This control enables maintenance personnel to avoid touching the housing 17 in the station power unit 6 when the housing 17 is in a charged state. If the housing 17 is in a charged state, maintenance personnel can ground the housing 17 to discharge the electricity for touching the housing 17.

Figure 2:
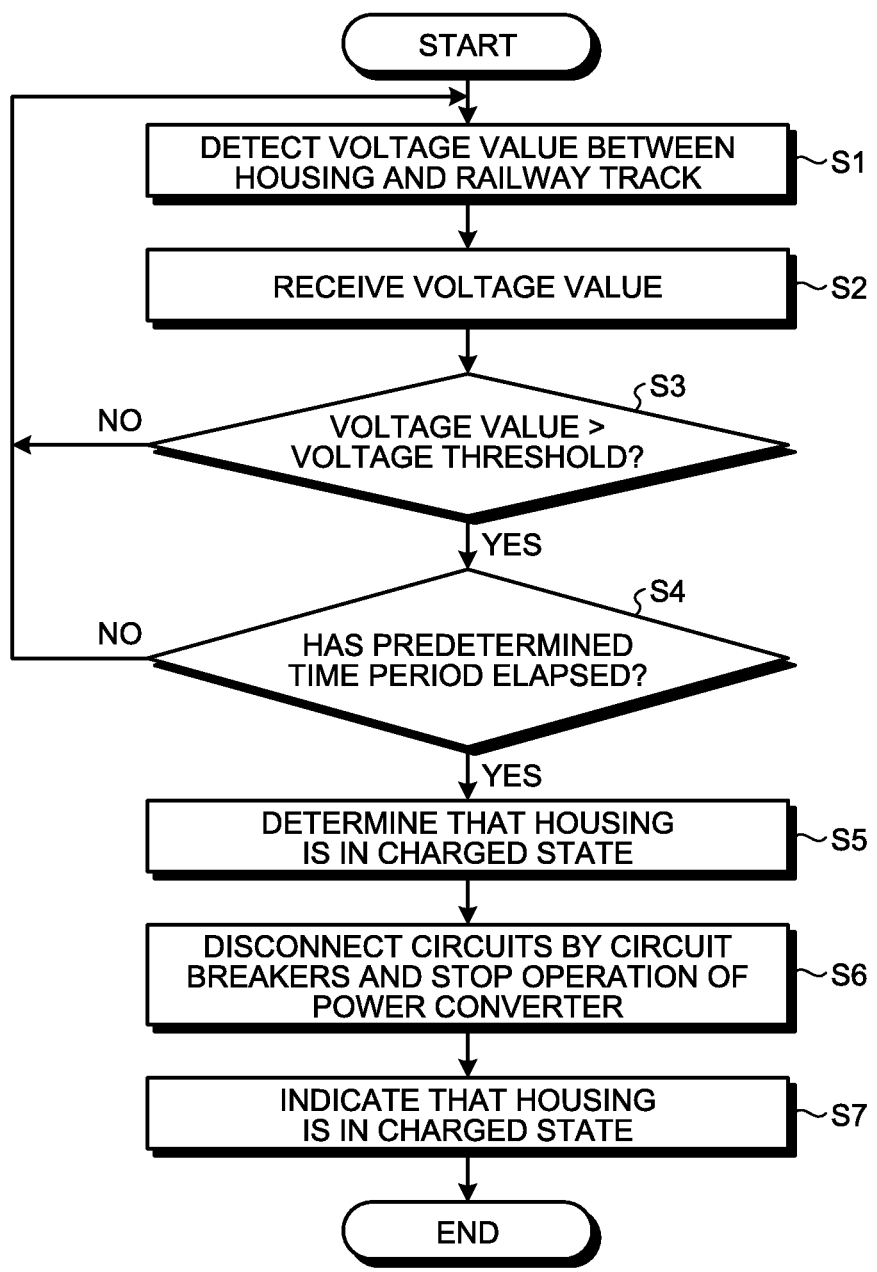
FIG. 2 is a flowchart illustrating a charged-state detection process performed in the station power unit according to the first embodiment.

An operation of the station power unit 6 will next be described. FIG. 2 is a flowchart illustrating a charged-state detection process performed in the station power unit 6 according to the first embodiment. First, in the station power unit 6, the voltage sensor 14 detects the charge status of the housing 17, specifically, the value of the voltage (voltage value) between the housing 17 and the railway track 3 (step S1). The first embodiment assumes that the housing 17 has a higher voltage than the voltage of the railway track 3.

The control unit 15 receives the voltage value detected by the voltage sensor 14 from the voltage sensor (step S2). In the station power unit 6, the control unit 15 may periodically read the voltage value detected by the voltage sensor 14 from the voltage sensor 14, or if the voltage sensor 14 has a notification capability, the voltage sensor 14 may periodically send the voltage value detected, to the control unit 15.

The control unit 15 compares the voltage value received from the voltage sensor 14 with a voltage threshold (step S3). The voltage threshold is a value for use in determination of whether or not the housing 17 is in a charged state. The value of the voltage threshold is configurable taking into account the effect on human body. If the voltage value received from the voltage sensor 14 is less than or equal to the voltage threshold (step S3: No), the station power unit 6 determines that the housing 17 is not in a charged state, and the process returns to step S1. Note that detection of a voltage value that is greater than 0 and less than or equal to the voltage threshold also means, in a precise sense, that the housing 17 is electrically charged with a voltage at a level having no effect on human body. However, if the voltage value of the housing 17 is less than or equal to the voltage threshold, such voltage level is herein regarded as having no effect on human body, and thus the housing 17 is treated as being not in a charged state. Also in the later embodiments, the housing 17 at a voltage level having no effect on human body is treated as being not in a charged state.

If the voltage value received from the voltage sensor 14 is greater than the voltage threshold (step S3: Yes), the control unit 15 checks whether a predetermined time period has elapsed since the voltage value received from the voltage sensor 14 has continuously exceeded the voltage threshold (step S4). As used herein, the predetermined time period is a time period for ignoring an instantaneous voltage change due to a surge, lightning, or the like. This is because an instantaneous exceedance of the voltage value received from the voltage sensor 14 above the voltage threshold due to a surge, lightning, or the like is not an abnormal event for the station power unit 6. The control unit 15 does not determine that the housing 17 is in a charged state if the voltage value received from the voltage sensor 14 has exceeded the voltage threshold for a time period shorter than the predetermined time period, even if the voltage value received from the voltage sensor 14 is greater than the voltage threshold.

If the predetermined time period has not yet elapsed since the voltage value received from the voltage sensor 14 has continuously exceeded the voltage threshold (step S4: No), the station power unit 6 does not determine that the housing 17 is in a charged state at this stage to ignore an instantaneous voltage change. The process then returns to step S1. Otherwise, if the predetermined time period has elapsed since the voltage value received from the voltage sensor 14 has continuously exceeded the voltage threshold (step S4: Yes), the control unit 15 determines that the housing 17 is in a charged state (step S5).

Following a determination that the housing 17 is in a charged state, the control unit 15 disconnects the connection with the train 4 side by means of the circuit breaker 11, and disconnects the connection with the station load 5 side by means of the circuit breaker 13 in a protective operation. In addition, the control unit 15 stops the operation of the power converter 12 in a protective operation (step S6). The control unit 15 then controls the display unit 16 to indicate that the housing 17 is in a charged state on the display unit 16 (step S7).

As described above, in the station power unit 6, the voltage sensor 14 detects the value of the voltage between the housing 17 and the railway track 3. If the voltage value detected by the voltage sensor 14 is greater than the voltage threshold, and such condition has continued for a predetermined time period, the control unit 15 determines that the housing 17 is in a charged state. The control unit 15 then interrupts the circuits by means of the circuit breakers 11 and 13, and stops the operation of the power converter 12 in a protective operation. The sequential order of controlling of the circuit breakers 11 and 13 and of the power converter 12 by the control unit 15 is not particularly limited. For example, the power converter 12 may be stopped first, followed by interruption by the circuit breakers 11 and 13;

or the circuit breaker 11, the power converter 12, and the circuit breaker 13 may be controlled in this order.

A hardware configuration of the station power unit 6 will next be described. In the station power unit 6, the circuit breakers 11 and 13 are each implemented by a switchgear unit. The power converter 12 is implemented by an inverter circuit. The voltage sensor 14 is implemented by a measurement device that measures a DC voltage. The display unit 16 is implemented by an LCD or LED. The housing 17 is a box frame or casing made of metal. The control unit 15 is implemented by a processing circuit. That is, the station power unit 6 includes a processing circuit for determining whether the housing 17 is in a charged state, and if it is determined that the housing 17 is in a charged state, interrupting the circuits by means of the circuit breakers 11 and 13, and stopping the operation of the power converter 12. The processing circuit may be a dedicated hardware element, or may be a combination of a central processing unit (CPU) that executes a program stored in a memory, and the memory.

Figure 3:
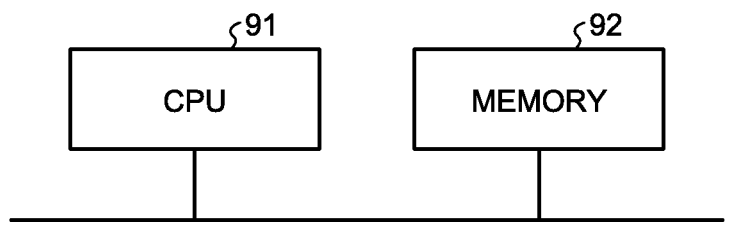
FIG. 3 is a diagram illustrating an example of the control unit of the station power unit according to the first embodiment in a case in which the control unit is formed of a CPU and a memory.

FIG. 3 is a diagram illustrating an example of the control unit 15 of the station power unit 6 according to the first embodiment in a case in which the control unit 15 is formed of a CPU and a memory. In the case in which the processing circuit is formed of a CPU 91 and a memory 92, the functions of the control unit 15 are implemented in software, firmware, or a combination of software and firmware. The software or firmware is described in the form of a program, and is stored in the memory 92. The processing circuit provides the functions thereof by the CPU 91 by reading a program stored in the memory 92. That is, the station power unit 6 includes the memory 92 for storing programs that, upon execution by the processing circuit, cause the control unit 15 to perform a step of determining whether the housing 17 is in a charged state, and steps of interrupting circuits by means of the circuit breakers 11 and 13, and of stopping the operation of the power converter 12 following a determination that the housing 17 is in a charged state. It can also be said that these programs cause the computer to perform the procedure and method of the station power unit 6. In this example, the CPU 91 may also be a processing device, a computing unit, a microprocessor, a microcomputer, a processor, a digital signal processor (DSP), or the like. The memory 92 may be, for example, a non-volatile or volatile semiconductor memory, such as a random access memory (RAM), a read-only memory (ROM), a flash memory, an erasable programmable ROM (EPROM), an electrically erasable programmable ROM (EEPROM); a magnetic disk, a flexible disk, an optical disk, a compact disc, a MiniDisc, or a digital versatile disc (DVD).

Figure 4:
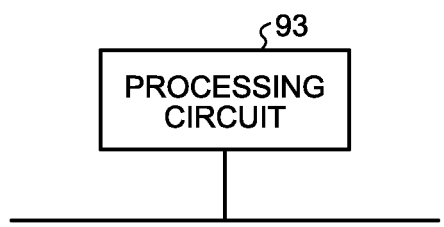
FIG. 4 is a diagram illustrating another example of the control unit of the station power unit according to the first embodiment in a case in which the control unit is formed of a dedicated hardware element.

FIG. 4 is a diagram illustrating another example of the control unit 15 of the station power unit 6 according to the first embodiment in a case in which the control unit 15 is formed of a dedicated hardware element. In the case in which the processing circuit is a dedicated hardware element, a processing circuit 93 illustrated in FIG. 4 may be, for example, a single circuit, a set of multiple circuits, a programmed processor, a set of multiple programmed processors, an application specific integrated circuit (ASIC), a field programmable gate array (FPGA), or a combination thereof. The functions of the control unit 15 may be implemented in the processing circuit 93 in a function specific manner, or implemented as a whole.

The functions of the control unit 15 may be implemented partly in a dedicated hardware element, and partly in software or firmware. Thus, the processing circuit can provide the functions described above by a dedicated hardware element, software, firmware, or a combination thereof.

As described above, according to the present embodiment, the station power unit 6 is configured as follows. The voltage sensor 14 detects the value of the voltage between the housing 17 of the station power unit 6 and the railway track 3. If the voltage value detected by the voltage sensor 14 is greater than the voltage threshold, and a predetermined time period has elapsed since the voltage value has continuously exceeded the voltage threshold, the control unit 15 determines that the housing 17 is in a charged state. The control unit 15 then interrupts the circuits by means of the circuit breakers 11 and 13, stops the operation of the power converter 12 in a protective operation, and causes the display unit 16 to indicate that the housing 17 is in a charged state. This operation enables maintenance personnel to avoid touching the housing 17 when the housing 17 of the station power unit 6 is in a charged state. Moreover, the control unit 15 causes the display unit 16 to indicate that the housing 17 is in a charged state, and can thus notify maintenance personnel in an early stage that the operation of the power converter 12 has been stopped, thereby allowing the station power unit 6 to be restored earlier. This enables excess regenerative power to be effectively used.

Second Embodiment

In a second embodiment, a current relay and a high-resistance circuit are used as the charged-state detection unit. Difference from the first embodiment will be described below.

Figure 5:
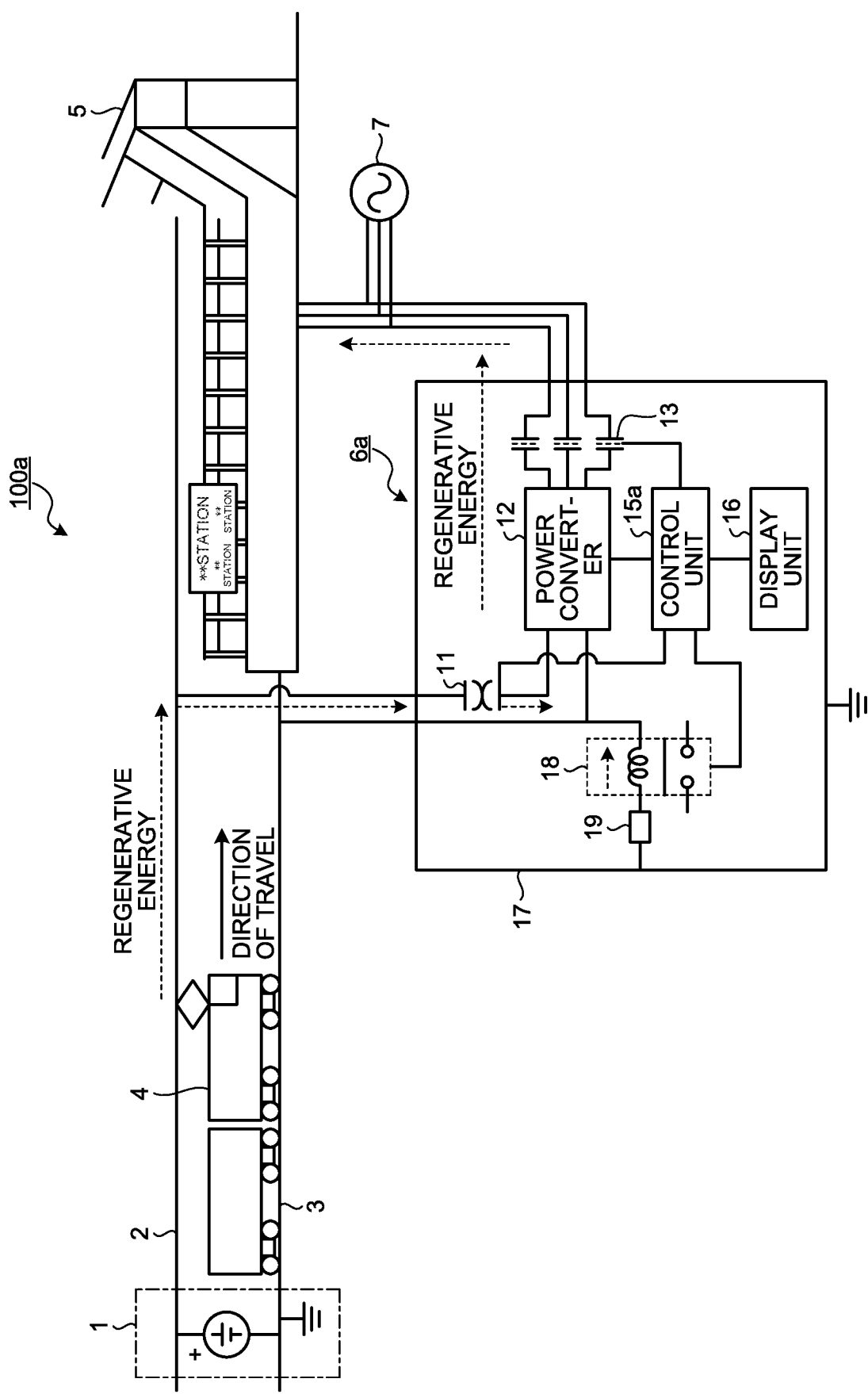
FIG. 5 is a diagram illustrating an example configuration of a railway system including a station power unit according to a second embodiment.

FIG. 5 is a diagram illustrating an example configuration of a railway system 100a including a station power unit 6a according to the second embodiment. The railway system 100a includes the station power unit 6a in place of the station power unit 6 as compared to the railway system 100. In the railway system 100a, the station power unit 6a operates similarly to the station power unit 6 in the railway system 100.

A configuration of the station power unit 6a will now be described. As compared to the station power unit 6, the station power unit 6a additionally includes a control unit 15a, a current relay 18, and a circuit 19 in place of the voltage sensor 14 and the control unit 15. In the second embodiment, the voltage sensor 14 of the first embodiment is replaced by the current relay 18 and the circuit 19. Thus, the current relay 18 and the circuit 19 together form the charged-state detection unit.

The current relay 18 turns on when the current flowing between the housing 17 and the railway track 3 on which the train 4 runs exceeds a current threshold. The current relay 18 includes an embedded coil, which acts as a magnet while a current is flowing therethrough, and operates the switch by a magnetic effect thereof to turn on the switch. The current threshold is a value for use in determination of whether or not the housing 17 is in a charged state. The value of the current threshold is configurable taking into account the effect on human body. The current relay 18 detects a charged state of the housing 17. The second embodiment assumes that if the housing 17 is in a charged state, a current greater than the current threshold flows through the current relay 18.

The circuit 19 is a circuit having a high resistance value. The circuit 19 has a resistance value determined such that a current greater than the current threshold will flow through the current relay 18 when the housing 17 is in a charged state.

The control unit 15*a* controls the operations of the circuit breakers 11 and 13, and of the power converter 12 based on whether the current relay 18 is in an ON or OFF state. The control unit 15*a* also controls what is displayed on the display unit 16.

In the first embodiment, the control unit 15 determines that the housing 17 is in a charged state if the voltage value detected by the voltage sensor 14 is greater than the voltage threshold, and a predetermined time period has elapsed. In the second embodiment, the control unit 15*a* determines that the housing 17 is in a charged state if the current relay 18 is in an ON state, and a predetermined time period has elapsed.

Figure 6:
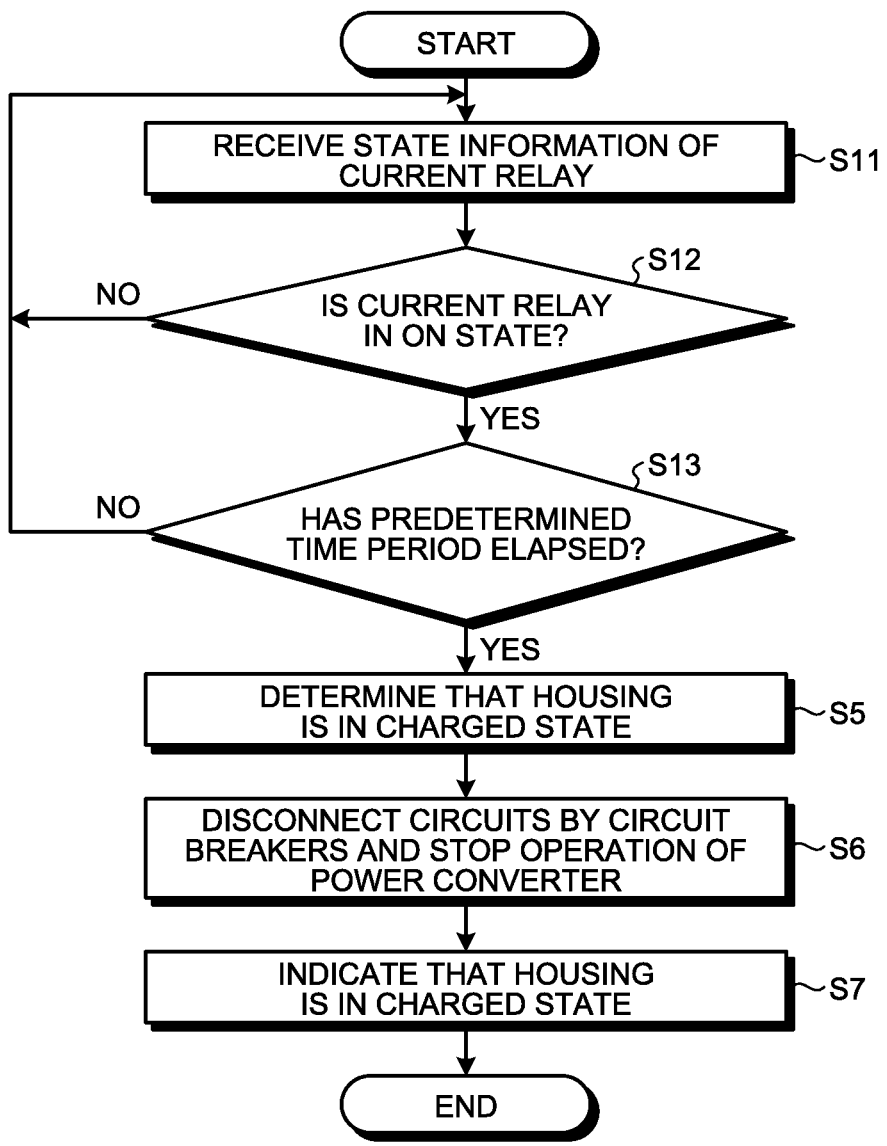
FIG. 6 is a flowchart illustrating a charged-state detection process performed in the station power unit according to the second embodiment.

An operation of the station power unit 6*a* will next be described. FIG. 6 is a flowchart illustrating a charged-state detection process in the station power unit 6*a* according to the second embodiment. First, in the station power unit 6*a*, the control unit 15*a* receives information on the charge status of the housing 17, specifically, information on the state of the current relay (step S11). In the station power unit 6*a*, the control unit 15*a* may periodically read the state of the current relay 18 from the current relay 18, or if the current relay 18 has a notification capability, the current relay 18 may periodically send information on the state of the current relay 18 to the control unit 15*a*.

The control unit 15*a* checks whether the current relay 18 is in an ON state (step S12). If the current relay 18 is in an OFF state (step S12: No), the station power unit 6*a* determines that the housing 17 is not in a charged state, and the process returns to step S11. Otherwise, if the current relay 18 is in an ON state (step S12: Yes), the control unit 15*a* checks whether a predetermined time period has elapsed since the current relay 18 has continuously turned on (step S13). As used herein, the predetermined time period is a time period for ignoring an instantaneous current change due to a surge, lightning, or the like. This is because an instantaneous change to an ON state of the state of the current relay 18 received from the current relay 18 caused by a surge, lightning, or the like is not an abnormal event for the station power unit 6*a*. The control unit 15*a* does not determine that the housing 17 is in a charged state if the current relay 18 has turned on for a time period shorter than the predetermined time period, even if the current relay 18 is in an ON state.

If the predetermined time period has not yet elapsed since the current relay 18 has continuously turned on (step S13: No), the station power unit 6*a* does not determine that the housing 17 is in a charged state at this stage to ignore an instantaneous voltage change. The process then returns to step S11. Otherwise, if the predetermined time period has elapsed since the current relay 18 has continuously turned on (step S13: Yes), the control unit 15*a* determines that the housing 17 is in a charged state (step S5). The process thereafter is performed similarly to the first embodiment.

The station power unit 6*a* has a hardware configuration in which the control unit 15*a* is implemented by a processing circuit similar to the processing circuit of the control unit 15 of the first embodiment.

As described above, according to the present embodiment, the station power unit 6*a* is configured as follows. The current relay 18 turns on when a current greater than a current threshold flows therethrough. If the current relay 18 is in an ON state, and a predetermined time period has elapsed since the current relay 18 has continuously turned on, the control unit 15*a* determines that the housing 17 is in a charged state. The control unit 15*a* then interrupts the circuits by means of the circuit breakers 11 and 13, stops the operation of the power converter 12 in a protective operation, and causes the display unit 16 to indicate that the housing 17 is in a charged state. This process can also provide an advantage similar to the advantage of the first embodiment.

Third Embodiment

In a third embodiment, a current sensor and a high-resistance circuit are used as the charged-state detection unit. Difference from the first and second embodiments will be described below.

Figure 7:
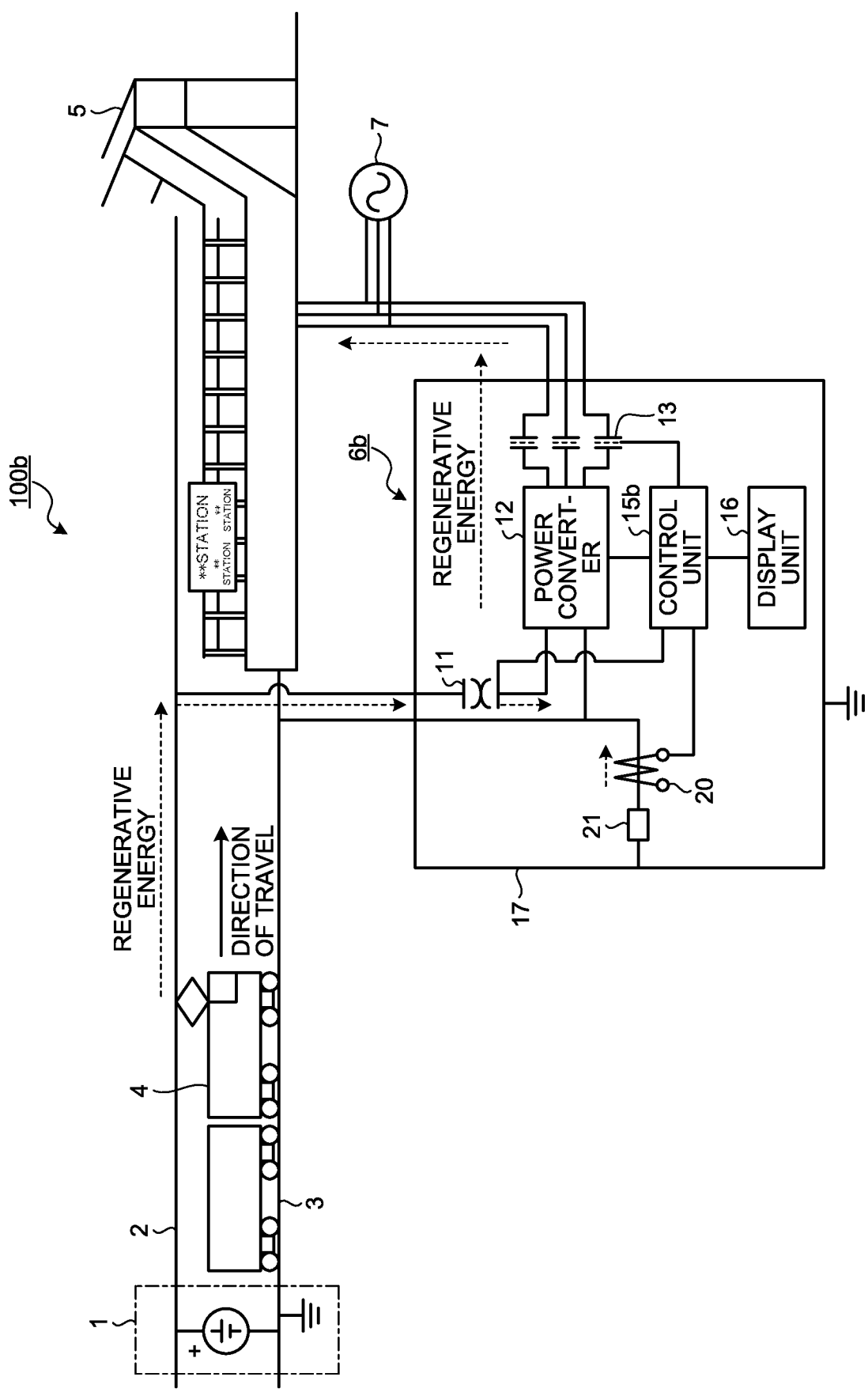
FIG. 7 is a diagram illustrating an example configuration of a railway system including a station power unit according to a third embodiment.

FIG. 7 is a diagram illustrating an example configuration of a railway system 100*b* including a station power unit 6*b* according to the third embodiment. The railway system 100*b* includes the station power unit 6*b* in place of the station power unit 6 as compared to the railway system 100. In the railway system 100*b*, the station power unit 6*b* operates similarly to the station power unit 6 in the railway system 100.

A configuration of the station power unit 6*b* will now be described. As compared to the station power unit 6, the station power unit 6*b* additionally includes a control unit 15*b*, a current sensor 20, and a circuit 21 in place of the voltage sensor 14 and the control unit 15. In the third embodiment, the voltage sensor 14 of the first embodiment is replaced by the current sensor 20 and the circuit 21. Thus, the current sensor 20 and the circuit 21 together form the charged-state detection unit.

The current sensor 20 detects a current value that is the value of the current flowing between the housing 17 and the railway track 3 on which the train 4 runs. The current sensor 20 detects a charged state of the housing 17.

The circuit 21 is a circuit having a high resistance value. The circuit 21 may have a resistance value determined such that a current greater than a current threshold will flow into the current sensor 20 when the housing 17 is in a charged state similarly to the circuit 19 of the second embodiment, or may have a resistance value different from the resistance value of the circuit 19. In the third embodiment, the control unit 15*b* has a capability to read the current value detected by the current sensor 20, and thus the value of the current threshold of the third embodiment may differ from the value of the current threshold of the second embodiment.

The control unit 15*b* controls the operations of the circuit breakers 11 and 13, and of the power converter 12 based on the current value detected by the current sensor 20, i.e., the detection result. The control unit 15*b* also controls what is displayed on the display unit 16.

In the first embodiment, the control unit 15 determines that the housing 17 is in a charged state if the voltage value detected by the voltage sensor 14 is greater than the voltage threshold, and a predetermined time period has elapsed. In the third embodiment, the control unit 15*b* determines that the housing 17 is in a charged state if the current value detected by the current sensor 20 is greater than the current threshold, and a predetermined time period has elapsed.

Figure 8:
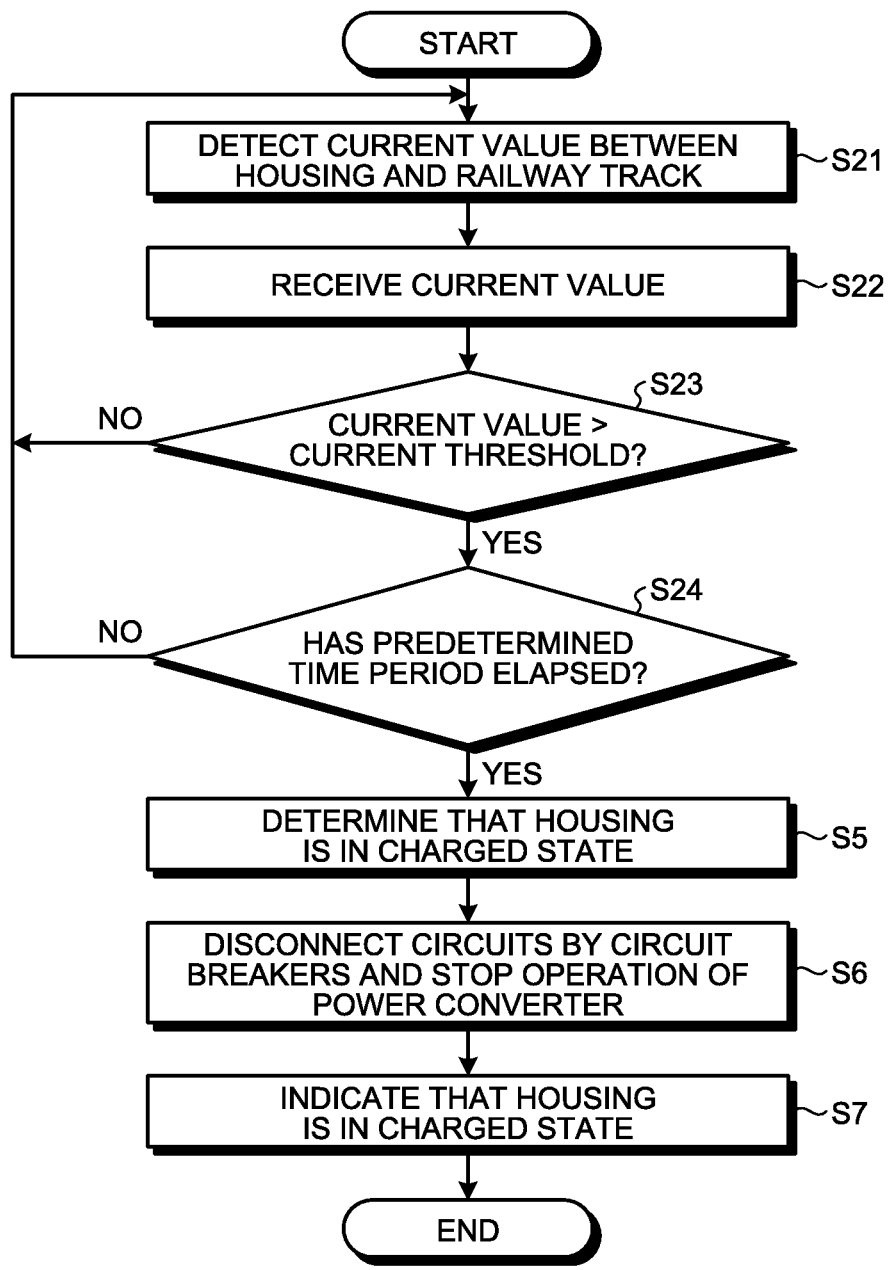
FIG. 8 is a flowchart illustrating a charged-state detection process performed in the station power unit according to the third embodiment.

An operation of the station power unit 6*b* will next be described. FIG. 8 is a flowchart illustrating a charged-state detection process in the station power unit 6*b* according to the third embodiment. First, in the station power unit 6*b*, the current sensor 20 detects the charge status of the housing 17, specifically, the current value between the housing 17 and the railway track 3 (step S21). The third embodiment assumes that the current flows in the direction from the housing 17 to the railway track 3.

The control unit 15*b* receives a current value detected by the current sensor 20 from the current sensor 20 (step S22). In the station power unit 6*b*, the control unit 15*b* may periodically read the current value detected by the current sensor 20 from the current sensor 20, or if the current sensor 20 has a notification capability, the current sensor 20 may periodically send the current value detected, to the control unit 15b.

The control unit 15b compares the current value received from the current sensor 20 with a current threshold (step S23). The current threshold is a value for use in determination of whether or not the housing 17 is in a charged state. If the current value received from the current sensor 20 is less than or equal to the current threshold (step S23: No), the station power unit 6b determines that the housing 17 is not in a charged state, and the process returns to step S21.

If the current value received from the current sensor 20 is greater than the current threshold (step S23: Yes), the control unit 15b checks whether a predetermined time period has elapsed since the current value received from the current sensor 20 has continuously exceeded the current threshold (step S24). As used herein, the predetermined time period is a time period for ignoring an instantaneous current change due to a surge, lightning, or the like. This is because an instantaneous exceedance of the current value received from the current sensor 20 above the current threshold due to a surge, lightning, or the like is not an abnormal event for the station power unit 6b. The control unit 15b does not determine that the housing 17 is in a charged state if the current value received from the current sensor 20 has exceeded the current threshold for a time period shorter than the predetermined time period, even if the current value received from the current sensor 20 is greater than the current threshold.

If the predetermined time period has not yet elapsed since the current value received from the current sensor 20 has continuously exceeded the current threshold (step S24: No), the station power unit 6b does not determine that the housing 17 is in a charged state to ignore an instantaneous voltage change. The process then returns to step S21. Otherwise, if the predetermined time period has elapsed since the current value received from the current sensor 20 has continuously exceeded the current threshold (step S24: Yes), the control unit 15b determines that the housing 17 is in a charged state (step S5). The process thereafter is performed similarly to the first embodiment.

The station power unit 6b has a hardware configuration in which the control unit 15b is implemented by a processing circuit similar to the processing circuit of the control unit 15 of the first embodiment.

As described above, according to the present embodiment, the station power unit 6b is configured as follows. The current sensor 20 detects the current value between the housing 17 of the station power unit 6b and the railway track 3. If the current value detected by the current sensor 20 is greater than the current threshold, and a predetermined time period has elapsed since the current value has continuously exceeded the current threshold, the control unit 15b determines that the housing 17 is in a charged state. The control unit 15b then interrupts the circuits by means of the circuit breakers 11 and 13, stops the operation of the power converter 12 in a protective operation, and causes the display unit 16 to indicate that the housing 17 is in a charged state. This process can also provide an advantage similar to the advantages of the first and second embodiments.

Fourth Embodiment

In a fourth embodiment, a control operation will be described for a case in which the station power unit 6 of the first embodiment uses multiple voltage thresholds.

The station power unit 6 and the railway system 100 including the station power unit 6 are configured similarly to those of the first embodiment. Although the fourth embodiment is described as using two voltage thresholds, which is merely by way of example, three or more voltage thresholds may be used. In the railway system 100 of the fourth embodiment, the voltage threshold described in relation to the first embodiment is used as a first voltage threshold, and a voltage threshold lower than the first voltage threshold is used as a second voltage threshold. The second voltage threshold is a value for use in determination of whether or not the voltage value in question may afterward reach the first voltage threshold, that is, the housing 17 may afterward change to a charged state even though the housing 17 is currently not in a charged state. The second voltage threshold can be set to, for example, a half (½) of the first voltage threshold.

Figure 9:
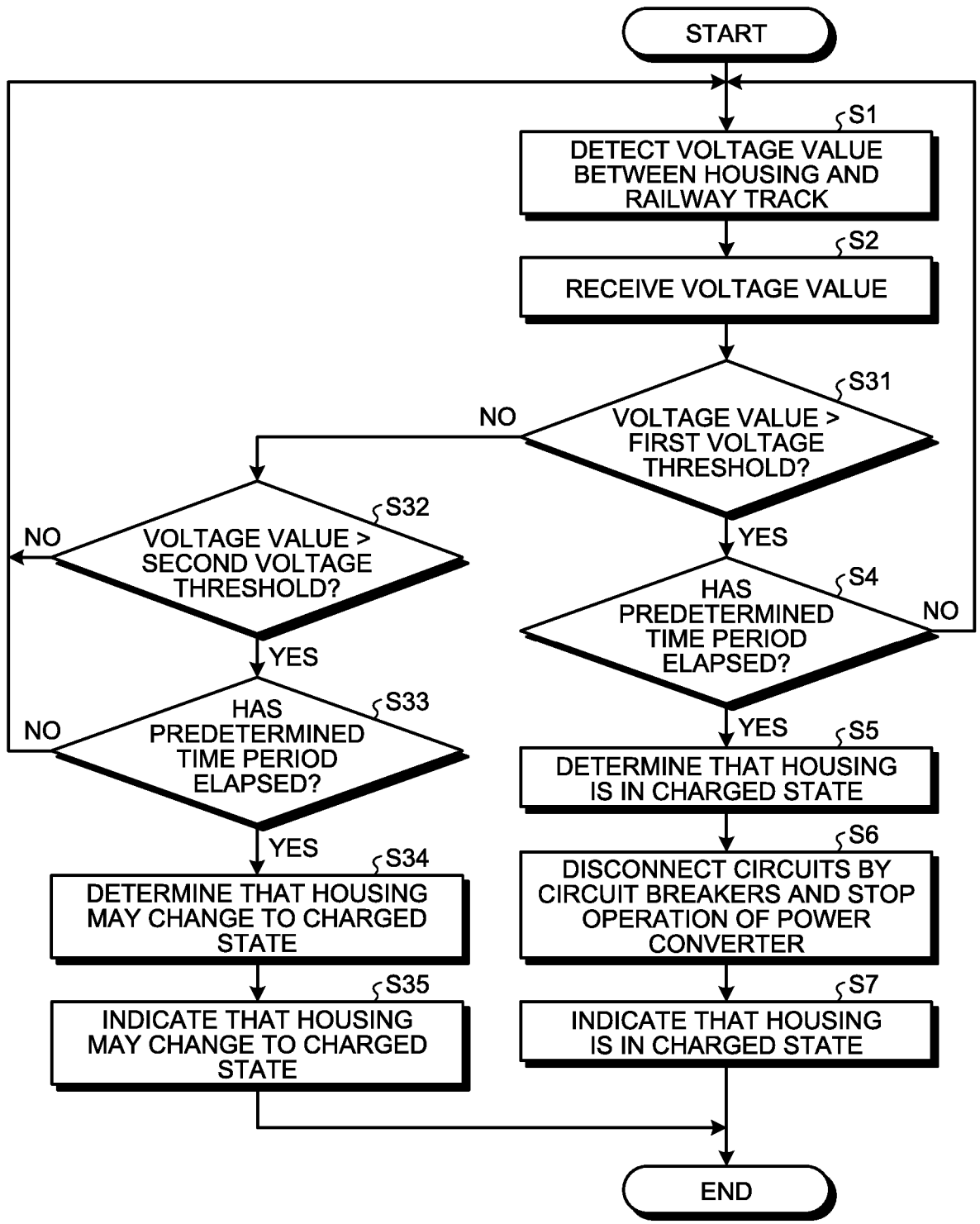
FIG. 9 is a flowchart illustrating a charged-state detection process performed in a station power unit according to a fourth embodiment.

An operation of the station power unit 6 will next be described. FIG. 9 is a flowchart illustrating a charged-state detection process performed in the station power unit 6 according to the fourth embodiment. Steps S1 and S2 are performed similarly to the first embodiment.

The control unit 15 compares the voltage value received from the voltage sensor 14 with a first voltage threshold (step S31). If the voltage value received from the voltage sensor 14 is greater than the first voltage threshold (step S31: Yes), the control unit 15 checks whether a predetermined time period has elapsed since the voltage value received from the voltage sensor 14 has continuously exceeded the first voltage threshold (step S4). If the result is Yes at step S31, the process thereafter is performed similarly to the first embodiment.

If the voltage value received from the voltage sensor 14 is less than or equal to the first voltage threshold (step S31: No), the control unit 15 compares the voltage value received from the voltage sensor 14 with a second voltage threshold (step S32). If the voltage value received from the voltage sensor 14 is less than or equal to the second voltage threshold (step S32: No), the station power unit 6 determines that the housing 17 is not in a charged state, or will not be in a charged state even afterward, and the process returns to step S1.

If the voltage value received from the voltage sensor 14 is greater than the second voltage threshold (step S32: Yes), the control unit 15 checks whether a predetermined time period has elapsed since the voltage value received from the voltage sensor 14 has continuously exceeded the second voltage threshold (step S33).

If the predetermined time period has not yet elapsed since the voltage value received from the voltage sensor 14 has continuously exceeded the second voltage threshold (step S33: No), the station power unit 6 does not determine that the housing 17 is in a charged state at this stage to ignore an instantaneous voltage change. The process then returns to step S1. Otherwise, if the predetermined time period has elapsed since the voltage value received from the voltage sensor 14 has continuously exceeded the second voltage threshold (step S33: Yes), the control unit 15 determines that the housing 17 may change to a charged state (step S34).

Following a determination that the housing 17 may change to a charged state, the control unit 15 does not perform a protective operation on the circuit breakers 11 and 13, and on the power converter 12 at this stage. The control unit 15 controls the display unit 16 to indicate, on the display unit 16, that the housing 17 may change to a charged state (step S35). If the display unit 16 is an LCD, the control unit 15 can display at step S35 a message different from the message displayed at step S7. If the display unit 16 is one or more LEDs, the control unit 15 can provide at step S35 an indication distinguishable from the indication provided at step S7, such as lighting with a different color, lighting a different number of LEDs, or use of a different lighting pattern such as blinking or continuous lighting. The flowchart of FIG. 9 of the fourth embodiment additionally includes the process from step S31 to step S35 in place of the process of step S3 as compared to the flowchart of FIG. 2 of the first embodiment.

As described above, according to the present embodiment, the station power unit 6 is configured such that the control unit 15 uses multiple voltage thresholds to determine that the housing 17 is currently not in a charged state, but may afterward change to a charged state. This operation enables the control unit 15 of the station power unit 6 to warn maintenance personnel of possibility of electrical charging of the housing 17 before performing a protective operation if the housing 17 is electrically charged. Note that use of three or more voltage thresholds enables the control unit 15 to provide warning in multiple stages.

Fifth Embodiment

In a fifth embodiment, a control operation will be described for a case in which the station power unit 6b of the third embodiment uses multiple current thresholds.

The station power unit 6b and the railway system 100b including the station power unit 6b are configured similarly to those of the third embodiment. Although the fifth embodiment is described as using two current thresholds, which is merely by way of example, three or more current thresholds may be used. In the railway system 100b of the fifth embodiment, the current threshold described in relation to the third embodiment is used as a first current threshold, and a current threshold lower than the first current threshold is used as a second current threshold. The second current threshold is a value for use in determination of whether or not the current value in question may afterward reach the first current threshold, that is, the housing 17 may afterward change to a charged state even though the housing 17 is currently not in a charged state. The second current threshold can be set to, for example, ½ of the first current threshold.

An operation of the station power unit 6b will next be described. FIG. 10 is a flowchart illustrating a charged-state detection process performed in the station power unit 6b according to the fifth embodiment. Steps S21 and S22 are performed similarly to the third embodiment.

The control unit 15b compares the current value received from the current sensor 20 with a first current threshold (step S41). If the current value received from the current sensor 20 is greater than the first current threshold (step S41: Yes), the control unit 15b checks whether a predetermined time period has elapsed since the current value received from the current sensor 20 has continuously exceeded the first current threshold (step S24). If the result is Yes at step S41, the process thereafter is performed similarly to the third embodiment.

If the current value received from the current sensor 20 is less than or equal to the first current threshold (step S41: No), the control unit 15b compares the current value received from the current sensor 20 with a second current threshold (step S42). If the current value received from the current sensor 20 is less than or equal to the second current threshold (step S42: No), the station power unit 6b determines that the housing 17 is not in a charged state, or will not be in a charged state even afterward, and the process returns to step S21.

If the current value received from the current sensor 20 is greater than the second current threshold (step S42: Yes), the control unit 15b checks whether a predetermined time period has elapsed since the current value received from the current sensor 20 has continuously exceeded the second current threshold (step S43).

If the predetermined time period has not yet elapsed since the current value received from the current sensor 20 has continuously exceeded the second current threshold (step S43: No), the station power unit 6b does not determine that the housing 17 is in a charged state at this stage to ignore an instantaneous voltage change. The process then returns to step S21. Otherwise, if the predetermined time period has elapsed since the current value received from the current sensor 20 has continuously exceeded the second current threshold (step S43: Yes), the control unit 15b determines that the housing 17 may change to a charged state (step S44). The control unit 15b controls the display unit 16 to indicate, on the display unit 16, that the housing 17 may change to a charged state (step S45). Steps S44 and S45 are performed similarly to steps S34 and S35 of the fourth embodiment. The flowchart of FIG. 10 of the fifth embodiment additionally includes the process from step S41 to step S45 in place of the process of step S23 as compared to the flowchart of FIG. 8 of the third embodiment.

As described above, according to the present embodiment, the station power unit 6b is configured such that the control unit 15b uses multiple current thresholds to determine that the housing 17 is currently not in a charged state, but may afterward change to a charged state. This process can also provide an advantage similar to the fourth embodiment. Note that, similarly to the fourth embodiment, use of three or more current thresholds enables the control unit 15b to provide warning in multiple stages.

The configurations described in the foregoing embodiments are merely examples of various aspects of the present invention. These configurations may be combined with a known other technology, and moreover, a part of such configurations may be omitted and/or modified without departing from the spirit of the present invention.

REFERENCE SIGNS LIST 1 electric power substation (substation); 2 overhead line; 3 railway track; 4 train; 5 station load; 6, 6a, 6b station building power supply device (station power unit); 7 commercial power supply; 11, 13 circuit breaker; 12 power converter; 14 voltage sensor; 15, 15a, 15b control unit; 16 display unit; 17 housing; 18 current relay; 19, 21 circuit; 20 current sensor; 100, 100a, 100b railway system.

The invention claimed is:

1. A station building power supplier that converts regenerative power generated by a regenerative brake of a direct current (DC)-fed train, into alternating current (AC) power, and supplies the AC power to a station load side, the station building power supplier comprising:
    a first circuit breaker to disconnect a connection with the DC-fed train side;
    a second circuit breaker to disconnect a connection with the station load side;
    a power converter disposed between the first circuit breaker and the second circuit breaker to convert the regenerative power into the AC power;
    a housing grounded, to house the power converter; and
    a charged-state detector connected between a railway track on which the DC-fed train runs and the housing to detect a charged state of the housing, the railway track grounded at a location different from a ground location of the housing.

2. The station building power supplier according to claim 1, wherein the charged-state detector detects a charge status of the housing during operations of the station building power supplier.

3. The station building power supplier according to claim 1, comprising:
a controller to control operations of the first circuit breaker, of the power converter, and of the second circuit breaker based on a detection result from the charged-state detector.

4. The station building power supplier according to claim 3, wherein the controller controls the operations of the first circuit breaker, of the power converter, and of the second circuit breaker based on the detection result from the charged-state detector following a determination that the housing is in a charged state.

5. The station building power supplier according to claim 4,
wherein
the charged-state detector includes a voltage sensor to detect a voltage value between the housing and a railway track on which the DC-fed train runs, and
in a case in which the voltage value detected in the charged-state detector is greater than a voltage threshold, and a predetermined time period has elapsed since the voltage value has continuously exceeded the voltage threshold, the controller determines that the housing is in a charged state.

6. The station building power supplier according to claim 5, comprising:
a monitor to display a charge status of the housing, wherein
the voltage threshold is used as a first voltage threshold, and a voltage threshold lower than the first voltage threshold is used as a second voltage threshold, and
in a case in which the voltage value detected in the charged-state detector is less than or equal to the first voltage threshold, but is greater than the second voltage threshold, and a predetermined time period has elapsed since the voltage value has continuously exceeded the second voltage threshold, the controller determines that the housing may afterward change to a charged state, and causes the monitor to indicate that the housing may afterward change to a charged state.

7. The station building power supplier according to claim 4,
wherein
the charged-state detector includes a current relay to turn on when a current flowing between the housing and a railway track on which the DC-fed train runs exceeds a current threshold, and
in a case in which a predetermined time period has elapsed since the current relay has continuously turned on in the charged-state detector, the controller determines that the housing is in a charged state.

8. The station building power supplier according to claim 4,
wherein
the charged-state detector includes a current sensor to detect a current value of a current flowing between the housing and a railway track on which the DC-fed train runs, and
in a case in which the current value detected in the charged-state detector is greater than a current threshold, and a predetermined time period has elapsed since the current value has continuously exceeded the current threshold, the controller determines that the housing is in a charged state.

9. The station building power supplier according to claim 8, comprising:
a monitor to display a charge status of the housing, wherein
the current threshold is used as a first current threshold, and a current threshold lower than the first current threshold is used as a second current threshold, and
in a case in which the current value detected in the charged-state detector is less than or equal to the first current threshold, but is greater than the second current threshold, and at least a predetermined time period has elapsed since the current value has continuously exceeded the second current threshold, the controller determines that the housing may afterward change to a charged state, and causes the monitor to indicate that the housing may afterward change to a charged state.

10. The station building power supplier according to claim 4, wherein following the determination that the housing is in a charged state, the controller disconnects the connection with the DC-fed train side by means of the first circuit breaker, disconnects the connection with the station load side by means of the second circuit breaker, and stops an operation of the power converter.

11. The station building power supplier according to claim 4, comprising:
a monitor to display a charge status of the housing, wherein
following the determination that the housing is in a charged state, the controller causes the monitor to indicate that the housing is in a charged state.

12. The station building power supplier according to claim 1, wherein the first circuit breaker and the second circuit breaker are housed in the housing.

13. A charged-state detection method in a station building power supplier including a first circuit breaker to disconnect a connection with a direct current (DC)-fed train side, a second circuit breaker to disconnect a connection with a station load side, a power converter disposed between the first circuit breaker and the second circuit breaker to convert regenerative power into alternating current (AC) power, and a housing grounded, to house the power converter, the method comprising:
detecting a charged state of the housing by a charged-state detector connected between a railway track on which the DC-fed train runs and the housing, the railway track grounded at a location different from a ground location of the housing.

14. The charged-state detection method according to claim 13, wherein in the detecting, a charge status of the housing during operations of the station building power supplier is detected.

15. The charged-state detection method according to claim 13, comprising:
performed by a controller, disconnecting the connection with a DC-fed train side by means of the first circuit breaker, disconnecting the connection with the station load side by means of the second circuit breaker, and stopping an operation of the power converter in a case in which the controller determines that the housing is in a charged state based on a detection result from the charged-state detector.

* * * * *